United States Patent [19]

Kern

[11] 4,266,004

[45] May 5, 1981

[54] PHOTOIMAGEABLE MATERIAL OF POLYMERIC MATERIAL HAVING ORGANIC SULFIDE AND PHOTO-OXIDATION SENSITIZER

[75] Inventor: Roland J. Kern, Chesterfield, Mo.

[73] Assignee: Monsanto Company, St. Louis, Mo.

[21] Appl. No.: 928,323

[22] Filed: Jul. 26, 1978

Related U.S. Application Data

[63] Continuation-in-part of Ser. No. 756,034, Dec. 30, 1976, abandoned.

[51] Int. Cl.$^3$ ................................................ G03C 1/68
[52] U.S. Cl. ............................... 430/269; 204/159.14; 204/159.15; 204/159.16; 430/270; 430/286; 430/287; 430/288; 430/913; 430/915; 430/921
[58] Field of Search ................ 96/115 R; 204/159.15, 204/159.16, 159.14; 430/269, 270, 286, 287, 288, 913, 915, 921

[56] References Cited

U.S. PATENT DOCUMENTS 3,145,104   8/1964   Oster et al. ............................ 96/33

OTHER PUBLICATIONS

Tetrahedron Letters, No. 47, pp. 4263–4266, 1976.
Webster's New Collegiate Dictionary, (1977), p. 1162.

*Primary Examiner*—Jack P. Brammer
*Attorney, Agent, or Firm*—Sughrue, Rothwell, Mion, Zinn and Macpeak

[57] ABSTRACT

The present invention relates to a photoimaging process whereby a polymeric film containing sulfide functionality is selectively exposed to incident radiation in the presence of oxygen and a photosensitizer so that the sulfur functionality is photooxidized to produce a latent image which may then be developed. Polymeric films containing photooxidizable organic sulfide functionality and preferably additional carbon-carbon double bond unsaturation, which are capable of being used in the foregoing process are also included within the scope of the present invention.

41 Claims, No Drawings

PHOTOIMAGEABLE MATERIAL OF POLYMERIC MATERIAL HAVING ORGANIC SULFIDE AND PHOTO-OXIDATION SENSITIZER

CROSS REFERENCE TO RELATED APPLICATIONS

This application is a continuation-in-part of application Ser. No. 756,034, filed Dec. 30, 1976 now abandoned.

BACKGROUND OF THE INVENTION

1. Field of the Invention

The invention relates to the production of photoimages by a process adaptable to a wide variety of graphic arts applications and which comprises the production of developable latent images in a polymeric substrate by the direct photooxidation of organic sulfide containing functional groups in the polymer. The invention is also directed to the sulfur containing polymer film materials per se.

2. Description of the Prior Art

The photoimaging of polymeric films by selective exposure to irradiation to effect localized cross-linking or curing is well known. The mechanisms involved frequently depend upon polymerization of cross-linking which is initiated by free radicals and which requires the presence of a peroxide or other source of free radicals. The exposed regions of the polymer film are generally rendered relatively insoluble when compared with the unexposed regions thus providing a latent image which may be developed by washing with a suitable solvent.

Photooxidative processes for imaging polymer films have been described in a number of issued U.S. Pat. Nos. e.g., 3,790,389, Heimsch et al; 3,801,320, Erickson; 3,847,609 and 3,926,642 both issued to Breslow et al, and 3,846,266, Duynstee et al. These processes achieve photoimaging by the photooxidation of

unsaturation in polymer films by exposure in the presence of oxygen and a photosensitizer. The photooxidation results in the production of hydroperoxides attached to the polymer chain at the site of the allylic unsaturation. The latent hydroperoxide polymer image may then be amplified and/or developed by a variety of techniques. The present invention does not depend for imaging upon the hydroperoxidation of

unsaturation, but the speed of the film is enhanced by the further presence of

unsaturation in the polymer substrate. In film embodiments where higher speed is a desirable property the co-presence of photooxidizable sulfur functiontality with

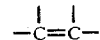

unsaturation constitutes a preferred embodiment of the invention.

SUMMARY OF THE INVENTION

It has now been discovered that photoimaging may be accomplished by the selective exposure of certain organic sulfide containing polymers to light in the presence of oxygen and a suitable photosensitizer.

Polymeric films suitable for use in the present invention must essentially contain adequate sulfide, e.g., —C—S—C— type, sulfur functionality. Suitable polymers can be obtained in a variety of ways of which the following are illustrative:

(a) Polymerization of a monomer in the presence of a thiol or disulfide, (b) The addition of a thiol to a preformed polymer containing an appropriate reactive site, such as a carboncarbon double bond, (c) Polymerization or copolymerization of sulfide containing monomers.

Species of sulfur polymers also expected to be operable are polymers with —S— or —S—S— units in the main chain.

The polymers used in this invention may be saturated or unsaturated, and the latter generally exhibit greater speed.

The photosensitizer is preferably blended into the polymer by admixture prior to film formation, but may also be incorporated after film formation. The photosensitizer must be capable of absorbing photons and then converting oxygen from a triplet to a highly reactive singlet state in which the oxygen reacts with the sulfur functionality in the polymer. The photosensitizer is generally regenerated at the end of the cycle.

Exposure of polymer films in accordance with this invention can be accomplished by techniques well known in the art.

Development of polymer films which have been photoimaged in accordance with this invention can be carried out by application of solvents to remove the relatively soluble portions of the film, or by techniques dependent upon other changes in film properties.

The polymer composition, usually incorporating admixed photosensitizer may be formed into a film or other structural configuration useful in graphic arts applications, such as, by solution coating the polymer onto a support.

DETAILED DESCRIPTION OF THE INVENTION

Polymer substrates suitable for use in this invention include any polymer comprising a sufficient amount of photoxidizable organic sulfide functionality such that a latent developable image can be produced by selective exposure to radiation of portions of a body of the polymer.

Satisfactory polymers may be produced in any of the following manners:

(1) Polymerizing monomers in the presence of a thiol or disulfide. Useful starting materials for such polymerization include any of the following monomers used to produce either homopolymers or appropriate copolymers: styrene, methyl methacrylate, butyl acrylate, butadiene, isoprene, acrylonitrile, ethylene, propylene, etc.

When the polymerization is conducted in the presence of a thiol compound, a cross-linking agent, such as, divinyl benzene or trimethylol propane trimethyacrylate or others well known in the art of cross-linking polymers must also be used.

While other polymerization methods might possibly be employed, emulsion polymerization is particularly suitable as it results in discrete cross-linked particles which can be coated to produce film materials by application from a benzene or like dispersion.

Illustrative of thiols which may be employed in this process are alkyl mercaptans, such as, n-dodecyl mercaptan, tert dodecyl mercaptan, p-thiocresol, pentaerythritol tetrakis (β-mercaptopropionate), and thioglycerol.

(2) Introduction of sulfide functionality into preformed polymers by the addition of a thiol at an unsaturated site, e.g., a

site or other reactive site on the polymer. Suitable polymers include, for example, butadiene or isoprene polymers or copolymers including both internal and pendant types of unsaturation. Polymers made by this method can be active and soluble, i.e., they need not be cross-linked, in contrast to the photopolymers prepared by the preceding method. Cross-linked polymeric starting materials may be used but are not required.

The fact that such polymers are functional in the invention is thought to involve sulfide functionality being introduced at more than one point in the polymeric moiety (chain or particle) in polymers produced by this method. Representative of this type of polymer are styrene-butadiene and methyl methacrylate-butadiene copolymers.

(3) Polymerizing or copolymerizing sulfur containing monomers such as vinyl sulfides, ethylthioethyl methacrylates, styrenes with sulfide ring substitution, etc.

The resulting polymeric substrates containing photooxidizable sulfide functionality may include, for example, polyolefins such as polyethylene, polypropylene, polymers of diolefins, such as polybutadiene, polymers of alpha, beta-unsaturated carboxlyic acid esters, acrylate or methacrylate esters, addition polymers of unsaturated hydrocarbons, vinylidene polymers, condensation polymers, such as, phenolformaldehydes, polyamides, such as nylons, etc. and various copolymers of the foregoing types of materials.

In addition to the above-described polymers it is believed that related species of sulfide containing polymers should be useful in similar photooxidation/photoimaging processes. For example polymers with —S— or —S—S— as units in the main polymer chain, e.g. poly(ethylene sulfide), poly(propylene sulfide) or Thiokol polysulfides such as may be prepared by the condensation of certain organic dihalides with $Na_2S$, $SCl_2$, $S_2Cl$ etc.

With respect to the concentration of photosensitizer, or more properly photooxidation sensitizer, the appropriate amount will depend on the specific polymer/sensitizer/exposure system to be employed and will have to be worked out empirically for each case. Generally, sufficient photooxidation sensitizer is added to generate sufficient singlet oxygen to set a developable image by reaction with the sulfur functionality of the polymer substrate. Using tetraphenylporphin (TPP), for example, a range of from about 0.1 mg to 10 mg/gm of polymer would generally be employed with a range of from about 1 to 5 mg/gm of polymer being preferred.

Any suitable photosensitizer may be used. TPP and other sensitizers of the porphin type and 1,8-dinaphthylenethiophene are preferred.

It would be impossible for applicant to experiment with all of the photooxidation sensitizers known in the art, but it is expected that many from the following types would be useful and it would be a matter of routine and simple experimentation for a person skilled in the art to select additional satisfactory sensitizers from the following categories:

(1) The aromatic group meso-substituted porphin compounds. Among such aromatic substituted porphins are the ms-tetraarylporphins (ms-meso). These compounds are those porphins in which aryl groups having from six to 24 carbon atoms are substituted on the bridging carbon atoms of the prophin ring structure which contains four pyrrole nuclei linked together in a circular pattern by four bridging carbon atoms to form a great ring. Examples of aryl groups which may be substituted in the meso-position of these compounds are phenyl, chlorophenyl, dichlorophenyl, methylphenyl, N,N-dimethylaminophenyl, hydroxyphenyl, naphthyl, biphenyl, anthracyl, phenanthryl, etc. In addition to the substituents in the aryl group substituents noted above, the aryl groups can also have any or a combination of such substituents, e.g., as alkyloxy (one to 20 carbon atoms) substituents such as methoxy, ethoxy, isopropoxy, butoxy, hexyloxy, etc., as well as any other substituents which do not change the fundamental aromatic character of the groups. These porphin sensitizers including the above exemplified arylporphins, can have various other substituents, particularly at the beta and beta' positions of the pyrrole rings, e.g., such substituents as lower alkyl (one to 20 carbon atoms) such as vinyl or allyl or alkanoic acid groups such as methylcarboxy or ethylcarboxy.

Examples of porphin compounds which are expected to be useful as photochemical sensitizers in practicing this invention are the arylporphins such as the tetraphenyltetrazoporphins and the complexes thereof, such as diamagnetic complexes, e.g., magnesium tetraphenyltetrazoporphin, tetraphenyl tetrazoporphin acetate, tetraphenyltetrazoporphin sulfate, zinc tetraphenyltetrazoporphin, and the meso-aryl porphins including alpha, beta, gamma, delta-naphthylporphin and the diamagnetic metal chelates thereof, e.g.,
tetraphenylporphin
tetrakis(2,4-dichlorophenyl)porphin
tetrakis(2-furyl)porphin
tetrakis(4-methoxyphenyl)porphin
tetrakis(4-methylphenyl)porphin
tetrakis(2-thienyl)porphin
tetraphenylporphin zinc complex
tetrakis(4-nitrophenyl)porphin
tetrakis(4-dimethylaminophenyl)porphin zinc complex;
the tetrabenzomonoazo- and tetrabenzodiazo porphins, the 1,2,3,4,5,6,7,8-octaphenylporphins and azoporphins such as octaphenylporphyrazine, the tetrabenzoporphins, e.g., tetrabenzoporphin and the zinc complex of tetrabenzoporphin.

(2) Other porphin types of photosensitizing materials include chlorophyll, such as chlorophyll α and chlorophyll β, hemin, the tetrazoporphins, chlorophyllin salt derivatives such as the reaction product of an alkaline metal chlorophyllin salt and sodium bisulfite, hematoporphin, mercury proto- and hemato-porphins, vitamin $B_{12}$ and its derivatives and tetrakis(1-naphthyl)porphin.

(3) Related porphin type materials include the phthalocyanine and metal complexes of phthalocyanine such as the zinc and magnesium complexes of phthalocycanine, as well as phthalocyanine derivatives such as the barium or calcium salts of the phthalocyanine sulfonic acid, acetylated phthalocyanine, alkoxy- and aryloxy-benzosubstituted phthalocyanines, 5,5',5",5"'-tetraamino-metalphthalocyanine-4,4',4",4"'-tetrasulfonic acid, magnesium tetra(4)methylthiophthalocyanine, arylthioethers of phthalocyanines, vinyl group containing tetraazoporphins and polymers thereof, mercaptoamino phthalocyanine derivatives and phthalocyanine.

(4) Other photosensitizers include fluorescein type dyes and light absorber materials based on a triarylmethane nucleus. Such compounds are well known and include Crystal Violet, Malachite green, Eosin, Rose Bengal and the like.

Polymer preparation routes 1 and 2, above, may actually occur concurrently during emulsion polymerization or copolymerization of butadiene or isoprene.

Suitable polymer substrates can contain varying amounts of sulfide functionality. Thus, the photoimaging systems of this invention can be sensitive at relatively low levels of sulfur, e.g., as low as 1 mole of sulfur per 2,500 moles of monomer units. For a typical thiol this amounts to about 25 mg per 40 g polymer. Even lower levels may be possible. Higher sulfur levels, e.g., 1 mole of sulfur per mole of monomer units have proved operable, and even higher levels are thought possible. Roughly speaking higher levels of sulfur result in higher speeds, but image quality also is influenced by sulfur content and so a series of complex variables needs to be balanced for each system.

Film materials can be produced using the photooxidation sensitized polymer substrates of this invention by any suitable method. Depending on the nature of the polymer film formation by coating from an emulsion dispersion, solution or melt of the polymer may be preferable. Illustratively, films may be formed by coating a layer of the polymer/photosensitizer admixture onto a suitable supporting substrate, such as, polyethylene, polypropylene or MYLAR (polyester) film.

Exposure may be accomplished by any suitable means, such as by the use of a Ascorlux 4 kilowatt pulsed xenon lamp at a distance of 30 inches for times ranging from about 1 sec. to 100 sec. The nature of the light source, distance of source from film, photopolymer speed, sensitizer level and other factors all will influence the time of exposure necessary to set an image. Exposure may be made through any light-differentiating target. Typically a silver-type mask is used.

Image development may be effected by a wide variety of techniques. For example, development may be accomplished by using solvent to selectively remove from the film surface either exposed or non-exposed regions based upon a differential in solubility resulting from exposure under photooxidation conditions. Organic developing solvents such as, trichlormethane, trichlorethane, methyl chloroform, methylchloroform-ethanol, benzene and toluene have been successfully employed. Aqueous, alcoholic, acid and alkaline developing baths are expected also to be useful.

Changes in dye receptivity, adhesiveness or tack and other property changes between exposed and unexposed regions may also be relied upon as a basis for the development of the latent image.

The developed images may, if desired, be transferred to receiving supports such as paperboard, cloth, leather, metal, plastic, etc.

It has also been observed that the speed and sensitivity of the system is markedly improved by the presence of unsaturation in the polymer chain or pendant to it. The reasons may be that the unsaturated functionality serves as a superior pigment binder and/or as a "comonomer" to promote image setting cross-linking in addition to the dimerization of radicals possibly arising from the photooxidized sulfide functionality.

The present invention should prove useful for colorproofing, contact film, photo printmaking and other graphic arts applications.

Compared with prior art systems relying upon photooxidation of polymer unsaturation to produce a latent hydroperoxidized polymer image, the present systems allow photoimaging to be accomplished in one to two orders of magnitude shorter time (or equivalent less radiation, less sensitizer, etc.) than is required for hydroperoxide imaging. In addition the present system requires less oxygen for image setting which is of importance where the exposure step is operated under oxygen restricted conditions, as for example, when exposure is carried out in a vacuum frame.

The invention will be appreciated more fully by reference to the following examples which are intended to be illustrative and not limiting.

EXAMPLE 1

A polymer was prepared by emulsion polymerization employing the following components: 40 g styrene, 2.0 g of 55% divinylbenzene, 0.2 g n-dodecylmercaptan, 83 g oxygen-free water, 1.2 g sodium lauryl sulfate, 0.1 g ammonium persulfate and 0.1 g sodium sulfite. From the dry isolated powdery product was prepared a dispersion by mixing 8 g polymer with 92 g benzene. To this dispersion was added 40 mg (5 mg/g polymer) of tetraphenylporphin (TPP). A cover of Al foil was provided for the bottle. When the sensitizer had dissolved about 1 gm of cyan pigment grind was added per fifteen grams of sensitized polymer dispersion and then shaken. A film of sensitized pigmented dispersion was drawn on a sheet of 0.5 ml polypropylene laminated to a 3 mil MYLAR sheet using a wire-wound rod of size 8 to 16 in subdued light. On air drying in the dark a photoactive film of about 1 micron thickness was formed.

The desired image to be copied, a transparency or silver negative, was placed on the photosensitized sheet as prepared above. To insure good contact between photo-active sheet and the target the two may be placed in a glass vacuum frame (NuArc Company). The composite was then exposed to the radiation of an Ascorlux (American Speedlight Corp.) pulsed xenon 4 kilowatt lamp at a distance of 30 in. for about twenty seconds. (This is principally visible radiation in the 360-800 micron range.) After exposure the pigmented photoactive film visually looked the same as before exposure. When placed in a pan and covered with methyl chloroform, the regions of the photoactive layer not exposed to radiation redisperse while those exposed to radiation remain in place (a negative-working process). This developing process generally requires from 15 to 20 seconds. The polypropylene/MYLAR substrate sheet on which is the developed cyan image is then removed from the bath and air dried briefly.

EXAMPLE 2

A polymer was prepared by emulsion polymerization employing 40 g styrene, 2.0 g trimethylolpropane trimethacrylate, 0.2 g n-butyl thioglycolate, 83 g oxygen-free water, 1.2 g sodium lauryl sulfate, 0.1 g ammonium persulfate and 0.1 g sodium sulfite. It was tested as in Example 1 except that a magenta pigment was employed. A good image was obtainable on 15 sec. exposure.

EXAMPLE 3

Example 1 was repeated except that no n-dodecyl-mercaptan was used. No image was obtained after 50 seconds exposure.

EXAMPLE 4

Styrene, 34 g, 6 g butadiene, 0.5 g. bromoform 83 g oxygen-free water, 1.2 g sodium lauryl sulfate, 0.1 g ammonium persulfate and 0.1 g sodium sulfite were emulsion copolymerized. The product was tested as in Example 1 and found not to form an image in 50 seconds exposure.

A latex of material using the above formulation was prepared unexposed to air. To it was added 1 g of n-butyl thioglycolate, 0.1 ammonium persulfate and 0.1 sodium sulfite. The mixture was agitated at 50° C. for 18 hours under nitrogen after which the polymer was isolated. A satisfactory yellow pigmented image was developed in benzene using this material exposed for 15 seconds with the radiation source of Example 1 but also using a neutral density filter which allowed only 0.09 of the incident radiation to reach the film. "½A" 5% coverage dots were held and 95% coverage "M" dots were open when a half tone silver image mask was used.

EXAMPLE 5

An emulsion polymerization was carried out at 50° C. for 18 hours using 32 g styrene, 1.6 g of 55% divinylbenzene, 0.5 g bromoform, 8 g butadiene, 83 g oxygen-free water, 1.2 g sodium lauryl sulfate, 0.1 g ammonium persulfate and 0.1 g sodium sulfite. The product polymer was isolated by precipitation in methanol and dried. 7.2 g was dispersed in 84 g benzene. Then 0.6 g n-butyl thioglycolate and 0.1 g recrystallized azobisisobutyronitrile were added and the mixture held at 50° C. for 18 hours. The product polymer was isolated and a cyan-pigmented film drawn in a photographic darkroom using a red safelight as in Example 1. The film was exposed 3 sec. using the source of Example 1 and a neutral density filter to decrease incident radiation by a factor of 0.09. On development in benzene a satisfactory image was obtained.

EXAMPLE 6

An emulsion polymerization was conducted using 34 g methyl methacrylate, 1.5 g trimethyloltrimethacrylate, 6.0 g butadiene, 83 g oxygen-free distilled water, 1.2 g sodium lauryl sulfate, 0.1 g ammonium persulfate and 0.1 g sodium sulfate. The polymer product was isolated and drawn as a cyan pigmented film as per Example 1. No image was obtained upon 50 sec. exposure and subsequent development.

The same composition as above was prepared except that 0.2 g of t-dodecyl mercaptan was also added before the polymerization was initiated. Using this product as in Example 1, image were attainable using 10 sec. of exposure from the source in Example 1 attenuated by a filter to 60% of its full value.

EXAMPLE 7

A cyan-pigmented film of poly(ethylthioethyl methacrylate) was prepared and exposed as in Example 1. After 20 sec. exposure and development in either methyl chloroform +5% ethanol or in toluene, a visible image was obtained although the image quality in terms of fidelity and resolution was not as good as the images obtained with the systems exemplified above.

EXAMPLE 8

An emulsion polymerization was conducted using 34 g styrene, 1 g ethylthioethyl methacrylate, 6.0 g butadiene, 0.1 n-dodecyl mercaptan, 83 g oxygen-free water, 1.2 g sodium lauryl sulfate, 0.1 g ammonium persulfate and 0.1 g sodium sulfite. The resulting polymer was isolated and drawn as a pigmented film as by the procedure of Example 1. An image was obtained on 5 sec. exposure with the source radiation being attenuated by a factor of 0.09 through a neutral density filter when developed in methyl chloroform +5% ethanol.

EXAMPLE 9

An emulsion polymerization was conducted as in Example 8 except using 84 g methyl methacrylate in place of the styrene. An image was obtained when developed after 45 sec. under the radiation source of Example 1 without any attenuation.

EXAMPLE 10

An emulsion polymerization was carried out using 29 g methyl methacrylate, 5 g ethylthioethyl methacrylate, 2.0 g trimethylolpropane trimethacrylate, 4.2 g butadiene, 0.2 g n-dodecyl mercaptan, 83 g oxygen-free water, 0.1 g ammonium persulfate and 0.1 g sodium sulfite. The isolated polymer product was drawn as a sensitized, pigmented film as in Example 1. A satisfactory image was obtained after development exposure to 15 sec. of radiation from the source of Example 1 attenuated by a factor of 0.09.

EXAMPLE 11

An emulsion polymerization was conducted using 25 g ethylthioethylmethacrylate, 5.0 g butadiene, 1.2 g trimethylpropane trimethacrylate, 0.1 g n-dodecylmercaptan, 83 g oxygen-free water, 1.2 g sodium lauryl sulfate, 0.1 g ammonium persulfate and 0.1 g sodium sulfite. The isolated polymer was drawn as a sensitized pigmented film as in Example 1. A high quality image was obtained on two seconds exposure to a flux of $4 \times 10^4$ ergs/cm$^2$/sec sensitized at a level of 0.1 wt% tetraphenylporphin. In this example a light meter was used to measure intensity of exposure.

EXAMPLE 12

An emulsion polymer was prepared using 29 g styrene, 1.6 g trimethylpropane triacrylate, 7.6 g of

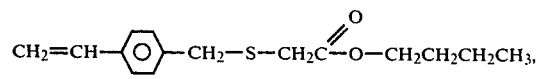

0.7 g n-dodecyl mercaptan, 6.0 g outadiene and the water emulsifier and initiators of Example 11. A good image was obtained on two second exposure to a visible flux of $4.0 \times 10^4$ ergs/cm$^2$/sec at a tetraphenylporphin level of 0.1 wt%.

EXAMPLE 13

An emulsion polymer was formed using 29 g methylmethacrylate, 5.9 g

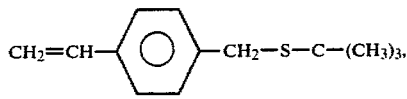

6.0 g butadiene, 1.6 g trimethylpropane triacrylate and 0.2 g n-dodecyl mercaptan as in Example 11. Imaging behavior similar to that obtained in Example 10 was observed.

While the invention has been described in detail and with reference to specific embodiments thereof, it will be apparent to one skilled in the art that various changes and modifications can be made therein without departing from the spirit and scope thereof.

What is claimed is:

1. A photoimageable polymeric element comprising a body of polymeric material containing organic sulfide functionality and a photooxidation sensitizer, said sensitizer and said sulfide functionally being present in an amount sufficient so that upon exposure to irradiation in the presence of oxygen a developable latent image is produced in said polymeric material, said exposure being of an intensity insufficient to produce a latent image in the absence of said sulfide functionality.

2. The element of claim 1 wherein said body of polymeric material further contains

unsaturation.

3. The element of claim 1 wherein said body of polymeric material is produced by polymerizing monomeric material in the presence of a thiol or disulfide and a cross-linking agent.

4. The element of claim 3 wherein said body of polymeric material contains discrete, cross-linked particle form polymer produced by emulsion polymerization.

5. The element of claim 4 wherein said body of polymeric material further contains

unsaturation.

6. The element of claim 1 wherein said body of polymeric material comprises a preformed polymer having said sulfide functionality introduced into said polymer at reactive sites.

7. The element of claim 6 wherein said reactive sites comprise unsaturated

sites.

8. The element of claim 6 wherein said preformed polymer is cross-linked.

9. The element of claim 1 wherein said body of polymeric material is the polymerization or copolymerization product of at least one sulfide containing monomer.

10. The element of claim 9 wherein said sulfide containing monomer is selected from the group consisting of vinyl sulfides and ethylthioethyl methacrylates.

11. The element of claim 1 wherein said body of polymeric material comprises a polymer with —S— or —S—S— units in the main polymer chain.

12. The element of claim 11 wherein said body of polymeric material comprises polyethylene sulfide.

13. The element of claim 11 wherein said body of polymeric material comprises polypropylene sulfide.

14. The element of claim 11 wherein said body of polymeric material comprises polysulfides.

15. The element of claim 1 wherein said body of polymeric material contains a polyolefin.

16. The element of claim 15 wherein said body of polymeric material contains polyethylene.

17. The element of claim 15 wherein said body of polymeric material contains polypropylene.

18. The element of claim 1 wherein said body of polymeric material contains a polydiolefin.

19. The element of claim 18 wherein said body of polymeric material contains a polybutadiene.

20. The element of claim 1 wherein said body of polymeric material contains a polymer of an alpha, betaunsaturated carboxylic acid ester.

21. The element of claim 20 wherein said body of polymeric material contains a polyacrylate polymer.

22. The element of claim 20 wherein said body of polymeric material contains a polymethacrylate polymer.

23. The element of claim 1 wherein said body of polymeric material contains a polyvinyl aromatic polymer.

24. The element of claim 23 wherein said body of polymeric material contains a polystyrene.

25. The element of claim 1 wherein said body of polymeric material contains a polyvinylidene polymer.

26. The element of claim 1 wherein said body of polymeric material contains a condensation polymer.

27. The element of claim 26 wherein said body of polymeric material contains a phenol-formaldehyde polymer.

28. The element of claim 1 wherein said body of polymeric material contains a polyamide polymer.

29. The element of claim 28 wherein said polyamide polymer is nylon.

30. The element of claim 1 which upon selective exposure to irradiation in the presence of oxygen and a photooxidation sensitizer is characterized by a relative difference in one or more physical or chemical properties in the exposed and unexposed regions such that said latent image may be developed.

31. The element of claim 30 wherein said difference is in relative solubility in a developing solvent.

32. The element of claim 30 wherein said difference is in relative dye receptivity to a developing dye.

33. The element of claim 30 wherein said difference is in relative adhesiveness or tack to a given substrate.

34. The element of claim 1 wherein a photooxidation sensitizer is incorporated into said body of polymeric material.

35. The element of claim 34 wherein said photooxidation sensitizer is a porphin.

36. The element of claim 35 wherein said porphin is tetraphenylporphin.

37. The element of claim 34 wherein said photooxidation sensitizer is dinaphthylene thiophene.

38. The element of claim 34 wherein said photooxidation sensitizer is rose bengal.

39. The element of claim 1 wherein said body of polymeric material is in the form of a thin film.

40. The element of claim 39 further comprising a support for said thin film.

41. The element of claim 40 wherein said support is a second thin film or layer to which said thin film of said body of polymeric material is temporarily or permanently bonded.

* * * * *